United States Patent
Dobberpuhl

(10) Patent No.: US 6,535,036 B1
(45) Date of Patent: Mar. 18, 2003

(54) CONDITIONAL CLOCK BUFFER CIRCUIT

(75) Inventor: Daniel W. Dobberpuhl, Menlo Park, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/136,109

(22) Filed: May 1, 2002

Related U.S. Application Data

(63) Continuation of application No. 09/961,611, filed on Sep. 24, 2001, now Pat. No. 6,411,152.

(51) Int. Cl.[7] .................................................. H03K 3/00

(52) U.S. Cl. .......................... 327/108; 327/291; 326/93

(58) Field of Search ....................... 327/108–112, 291; 326/93, 95

(56) References Cited

U.S. PATENT DOCUMENTS

| | | | | |
|---|---|---|---|---|
| 4,061,933 | A | * 12/1977 | Schroeder et al. | 327/161 |
| 5,459,736 | A | 10/1995 | Nakamura | 714/731 |
| 5,689,517 | A | 11/1997 | Ruparel | 714/731 |
| 5,815,725 | A | 9/1998 | Feierbach | 713/322 |
| 5,831,462 | A | 11/1998 | Witt et al. | 327/199 |
| 6,223,282 | B1 | 4/2001 | Kang | 712/241 |
| 6,247,134 | B1 | 6/2001 | Sproch et al. | 713/320 |
| 6,272,667 | B1 | 8/2001 | Minami et al. | 716/6 |
| 6,318,911 | B1 | 11/2001 | Kitahara | 716/6 |
| 6,411,152 | B1 | 6/2002 | Dobberpuhl | 327/291 |

FOREIGN PATENT DOCUMENTS

EP    522 413    1/1993

OTHER PUBLICATIONS

Weiss, et al., "The On–Chip 3MB Subarray Based 3$^{rd}$ Level Cache on an Itanium Microprocessor," IEEE, ISSCC 2002, Session 6, 3 pages.

Josephson, et al., "Test Methodology for the McKinley Processor," IEEE, ITC International Test Conference, Paper 21.1., 2001, pp. 578–585.

Stephany, et al., "FP 15.5: A 200 MHz 32b 0.5W CMOS RISC Microprocessor," Digital Semiconductor, Austin, TX, IEEE, 1998, pp. 15.5–1 to 15.5–9.

Santhanam, et al., "SA 18.6: A Low–Cost 300MHz RISC CPU with Attached Media Processor," Digital Equipment Corp., Palo Alto, CA, IEEE, 1998, pp. 18.6–1 to 18.6–9.

Montanaro, et al., "A 160–MHz, 32–b, 0.5–W CMOS RISC Microprocessor," IEEE Journal of Solid–State Circuits, vol. 31, No. 11, Nov. 1996, 12 pages.

SiByte, "Target Applications," http://sibyte.com/mercurian/applications.htm, Jan. 15, 2001, 2 pages.

SiByte, "SiByte Technology," http://sibyte.com/mercurian/technology.htm, Jan. 15, 2001, 3 pages.

SiByte, "The Mercurian Processor," http://sibyte.com/mercurian, Jan. 15, 2001, 2 pages.

SiByte, "Fact Sheet," SB–1 CPU, Oct. 2000, rev. 0.1, 1 page.

SiByte, "Fact Sheet," SB–1250, Oct. 2000, rev. 0.2, 10 pages.

(List continued on next page.)

*Primary Examiner*—Kenneth B. Wells
(74) *Attorney, Agent, or Firm*—Lawrence J. Merkel; Meyertons, Hood, Kivlin, Kowert & Goetzel, P.C.

(57) ABSTRACT

A conditional clock buffer circuit is disclosed. In one embodiment, a conditional clock buffer circuit includes a precharge circuit, a first transistor and a second transistor coupled to the precharge circuit via the first node and the second node, a third transistor coupled to the first transistor and the second transistor. The first transistor may be activated responsive to a condition external to the clock buffer circuit. When the first transistor is activated, an output clock signal driven by the clock buffer circuit may be inhibited.

18 Claims, 4 Drawing Sheets

OTHER PUBLICATIONS

Stepanian, SiByte, SiByte SB–1 MIPS64 CPU Core, Embedded Processor Forum 2000, Jun. 13, 2000, 15 pages.

Jim Keller, "The Mercurian Processor: A High Performance, Power–Efficient CMP for Networking," Oct. 10, 2000, 22 pages.

Tom R. Halfhill, "SiByte Reveals 64–Bit Core For NPUs; Independent MIPS644 Design Combines Low Power, High Performance," Microdesign Resources, Jun. 2000, Microprocessor Report, 4 pages.

SiByte, Letter from Anu Sundaresan, May 18, 2000, 1 page.

Santhanam, et al., Presentation for: "A 1GHz Power Efficient Single Chip Multiprocessor System For Broadband Networking Applications," Broadcom Corporation, Jun. 14, 2001, 19 pages.

Santanam, et al. "A 1GHz Power Efficient Single Chip Multiprocessor System For Broadband Networking Applications," Broadcom Corporation, Jun. 14, 2001, 4 pages.

* cited by examiner

CONDITIONAL CLOCK BUFFER CIRCUIT

This application is a continuation of U.S. patent application Ser. No. 09/961,611, filed on Sep. 24, 2001, now U.S. Pat. No. 6,411,152.

BACKGROUND OF THE INVENTION

1. Field of the Invention

This invention relates to electronic circuits, and more particularly, to clock buffer circuits.

2. Description of the Related Art

As electronic circuits increase in density, particularly integrated circuits, power consumption has also increased. In order to minimize power consumption, power management circuitry may be used. Power management circuitry may be used to selectively and/or temporarily remove power from a certain part of an electronic circuit during times while that part is inactive. Alternatively or in addition, conditional clocking schemes may be used.

Conditional clocking may be used to conditionally generate a clock signal to a functional circuit dependent on whether or not the functional circuit is active. If the circuit is active, the clock signal is generated (e.g. rising and falling edges are generated providing a high phase and a low phase of the clock signal). If the circuit is inactive, the clock signal may be inhibited (e.g. held in a constant state instead of toggling high and low). Inhibiting the clock signal during idle times for the functional circuit may result in power savings since the state of the circuit is held steady and thus the circuit may experience minimal switching activity. Typically, the condition input to the conditional clock circuitry (which determines whether the clock signal is generated or inhibited) has a relatively high setup time with regard to an input clock edge, to ensure glitch free operation of the conditional clock signal.

SUMMARY OF THE INVENTION

A conditional clock buffer circuit is disclosed. In one embodiment, a conditional clock buffer circuit includes a precharge circuit configured to precharge a first node and a second node, a first transistor and a second transistor coupled to the precharge circuit via the first node and the second node, respectively, and a third transistor coupled to the first transistor and the second transistor. The first transistor may be activated responsive to a condition external to the clock buffer circuit. When the first transistor is activated, an output clock signal driven by the clock buffer circuit may be inhibited.

In one embodiment, the clock buffer circuit may be configured to drive a clock signal to functional logic. Power management for the functional logic maybe controlled by conditional clocking from the clock buffer circuit. The clock buffer circuit may include a condition input. When a certain condition is asserted on the condition input, the clock buffer circuit may prevent transitions of the output clock signal. This may result in reduced power consumption by the functional logic receiving the output clock signal. When the condition which caused the circuit to inhibit the output clock signal is removed, the clock buffer circuit may once again begin driving the output clock signal to the functional logic.

Thus, in various embodiments, the conditional clock buffer circuit may be used to provide conditional clocking to various logic circuits. The conditional clock buffer circuit may be used in providing fine-grain power management functions to a chip.

BRIEF DESCRIPTION OF THE DRAWINGS

Other aspects of the invention will become apparent upon reading the following detailed description and upon reference to the accompanying drawings in which.

Figure 1:
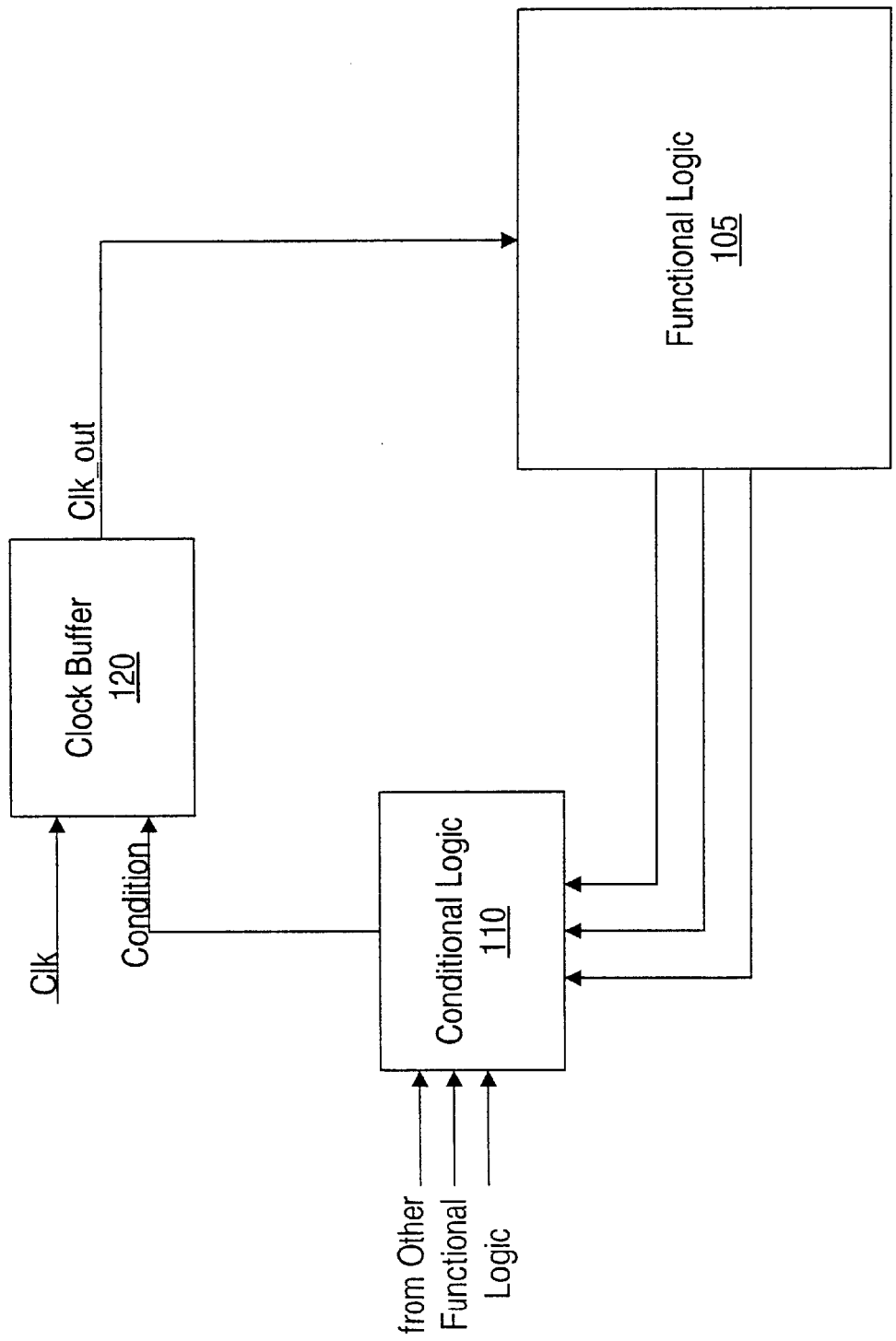
FIG. 1 is a block diagram of a system in which one embodiment of a clock buffer circuit may be implemented.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF EMBODIMENTS

Turning now to FIG. 1, a block diagram of a circuit in which one embodiment of a clock buffer circuit 120 may be implemented is shown. In the embodiment shown, clock buffer circuit 120 is a conditional clock buffer circuit, and is configured to receive an input clock signal, Clk, and drive an output clock signal, Clk_out, to functional logic 105. Functional logic 105 may be any type of clocked logic circuit. In various embodiments, functional logic 105 may be an integrated circuit, or a portion of an integrated circuit. Some integrated circuits may include a plurality of clock buffers 120, each having an associated conditional logic 110 and an associated functional logic 105. Employing multiple instances of clock buffer 120 and conditional logic 110 in an integrated circuit may allow for fine grain power management.

Conditional logic 110 may be coupled to functional logic 105. Conditional logic 110 may monitor operation in functional logic 105 and/or other logic coupled to the functional logic 105 (not shown in FIG. 1). If conditional logic 110 detects that the functional logic 105 is idle, conditional logic 110 may assert a condition signal, which may be received by clock buffer circuit 120. In response to the asserted condition signal, the clock buffer circuit 120 may inhibit transitions of the output clock signal, Clk_out. Inhibiting the clock transitions of the output clock signal may result in reduced power consumption by the functional logic 105.

On the other hand, if the conditional logic 110 determines that the functional logic 105 is not idle, the conditional logic 110 deasserts the condition signal. The clock buffer circuit 120 may generate the clock signal Clk_out responsive to the deasserted condition signal.

Figure 2:
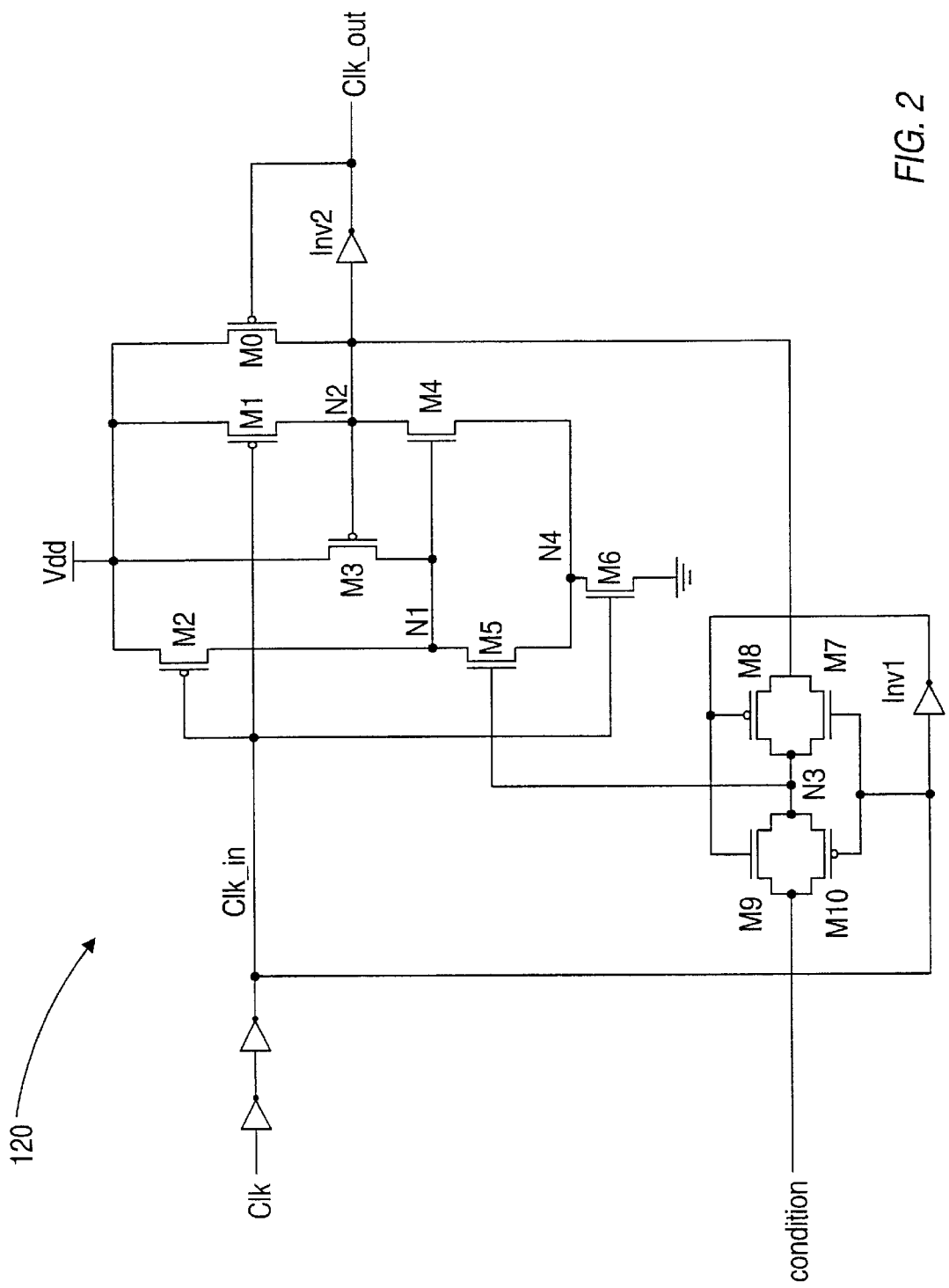
FIG. 2 is a schematic diagram of one embodiment of a clock buffer circuit.

Moving now to FIG. 2, a schematic diagram of one embodiment of clock buffer circuit 120 is shown. In the embodiment shown, clock buffer circuit 120 includes a pair of inverters for receiving the input clock signal (Clk). The inverters provide buffering for the Clk clock signal, producing the clock signal Clk_in. The inverters are optional buffering circuitry and may be eliminated in other embodiments. In some embodiments, clock buffer circuit 120 may be configured to produce Clk_in from an input clock signal Clk and a second clock signal having a 90° phase shift with respect to the input clock signal (referred to as quadrature clocks). In such embodiments, the clock signal. Clk_in may be an exclusive OR of the clock signal Clk and the second clock signal and the clock signal Clk_in may be twice the frequency of the clock signal Clk.

Clock buffer circuit 120 also includes a condition input circuit for receiving a condition signal from conditional logic 110 comprising the transistors M7, M8, M9, and M10. The transistors M9 and M10 form a first passgate circuit coupled to receive the condition signal and coupled to the node N3. The transistors M7 and M8 form a second passgate circuit coupled between the node N3 and the node N2. The first passgate circuit is open during the low phase of the clock signal Clk_in and closed during the high phase of the clock signal Clk_in. The second passgate circuit is open during the high phase of the clock signal Clk_in and closed during the low phase of the clock signal Clk_in. In the embodiment shown, the condition signal is passed from the input to node N3 by the first passgate circuit responsive to the low phase of the clock signal. The condition signal is latched at node N3 responsive to the rising edge of the clock signal. The second passgate circuit may be used to feedback the voltage on the node N2 to the node N3 circuit in order to ensure stability of the node N3 during the high phase of the clock signal Clk_in.

The clock buffer circuit 120 as illustrated in FIG. 2 further includes an inverter Inv2 and the transistors M0, M1, M2, M3, M4, M5, and M6. Transistor M0 has a source terminal coupled to the voltage reference node ($V_{dd}$), a drain terminal coupled to the node N2, and a gate terminal coupled to receive the clock signal Clk_out. The inverter Inv2 is coupled between the node N2 and the node carrying the clock signal Clk_out. Transistor M1 has a source terminal coupled to the voltage reference node, a drain terminal coupled to the node N2, and a gate terminal coupled to receive the clock signal Clk_in. Transistor M2 has a source terminal coupled to the voltage reference node, a drain terminal coupled to the node N1, and a gate terminal coupled to receive the clock signal Clk_in. The transistor M3 has a source terminal coupled to the voltage reference node, a drain terminal coupled to the node N1, and a gate terminal coupled to the node N2. Transistor M4 has a drain terminal coupled to the node N2, a source terminal coupled to the node N4, and a gate terminal coupled to the node N1. Transistor M5 has a drain terminal coupled to the node N1, a source terminal coupled, to the node N4, and a gate terminal coupled to the node N3. Transistor M6 has a drain terminal coupled to the node N4, a source terminal coupled to a ground reference node, and a gate terminal coupled to receive the clock signal Clk_in.

The transistors M1 and M2 may form a precharge circuit which precharges the nodes N1 and N2 during the low phase of the clock signal Clk_in. Since the node N2 is precharged, the clock signal Clk_out is also low responsive to the low phase of the clock signal Clk_in.

In response to an assertion of the condition signal (latched at node N3), transistor M5 is activated. Activating transistor M5 may effectively create a short circuit between the gate and source terminals of the transistor M4 (nodes N1 and N4), preventing a voltage drop across those terminals. Since the transistor M4 is deactivated, the node N2 is not drained and thus the clock signal Clk_out remains in a low state (the clock signal Clk_out is inhibited). A relatively short setup time may be supported, in one embodiment, for the condition signal. The condition signal setup time for assertion may depend on the amount of time elapsing from the assertion to the deactivation of transistor M4 through transistor M5 as compared to the amount of time from the rising edge of the clock signal Clk_in to the node N2 having significant charge drained through the combination of transistors M4 and M5.

The node N1 may be discharged through the combination of the transistors M5 and M6 in response to the high phase of the clock signal Clk_in and the condition signal being asserted. Discharging the node N1 may further ensure that the transistor M4 remains deactivated responsive to the asserted condition input signal. If the transistor M4 is deactivated, the stability of the voltage on the node N2 may be provided through the transistor M0. The transistor M0 may be optional and may be deleted in other embodiments.

In response to the condition signal being deasserted, the clock signal may propagate through the clock buffer circuit 120. In the embodiment shown, transistor M5 is deactivated when the condition signal is not asserted. Since the node N1 was precharged during the low phase of the clock, the transistor M4 may be activated. In response to the rising edge of the clock signal Clk_in, the transistor M6 is activated and the combination of transistor M4 and M6 may discharge the node N2. Discharging the node N2 causes the inverter Inv2 to charge the clock signal Clk_out, providing a rising edge on the clock signal Clk_out. The high phase of the clock signal Clk_out may continue until the transistor M1 precharges the node N2 in response to the low phase of the clock signal Clk_in. The discharging of the node N2 also activates the transistor M3, which may provide stability for the voltage on the node N1 since the transistors M2 and M5 are deactivated. Transistor M3 may be optional and may be deleted in other embodiments.

The setup time for the condition signal, according to one embodiment, may be further understood with regard to the signal on the node N4. The node N4 is precharged during the low phase of the clock signal Clk_in (by the transistor M1 through the transistor M4, and also by the transistor M2 through the transistor M5 if the condition signal is asserted during the precharge phase). The node N4 is discharged during the high phase of the clock through the transistor M6. Accordingly, the node N4 may track the clock signal Clk_in, 180° out of phase plus a relatively small delay.

If the condition signal is to be asserted, the setup time may be approximately coincident with the falling edge of the signal on the node N4. The condition signal may even assert somewhat later, as long as the output clock signal Clk_out is not glitched as a result. While the signal on the node N4 is at a high state, the transistor M4 is off (since there is not a positive gate-to-source voltage on the transistor M4). Thus, as long as the transistor M5 is activated at approximately the same time as the falling edge of the node N4 begins, maintaining the lack of a positive gate-to-source voltage on the transistor M4, the transistor M4 may remain deactivated and the rising edge of the clock signal Clk_out does not occur.

If the condition signal is to be deasserted, the setup time may again be approximately coincident with the falling edge of the signal on the node N4. In this case, the condition signal may be deasserted early enough to ensure that the transistor M5 does not activate in response to the falling edge of the signal on the node N4. Furthermore, if the condition signal is deasserted even later, the result may be only that the rising edge of the clock signal Clk_out is delayed.

In one particular implementation, the relative channel widths of various transistors (normalized to the channel width of M3) may be as follows:

M3: 1
M0: 2
M4: 4
M5: 12
M6: 12

Other implementations having different relative channel widths are possible and contemplated. Channel widths may also be varied based on the particular circuit configuration of alternate embodiments.

Figure 3:
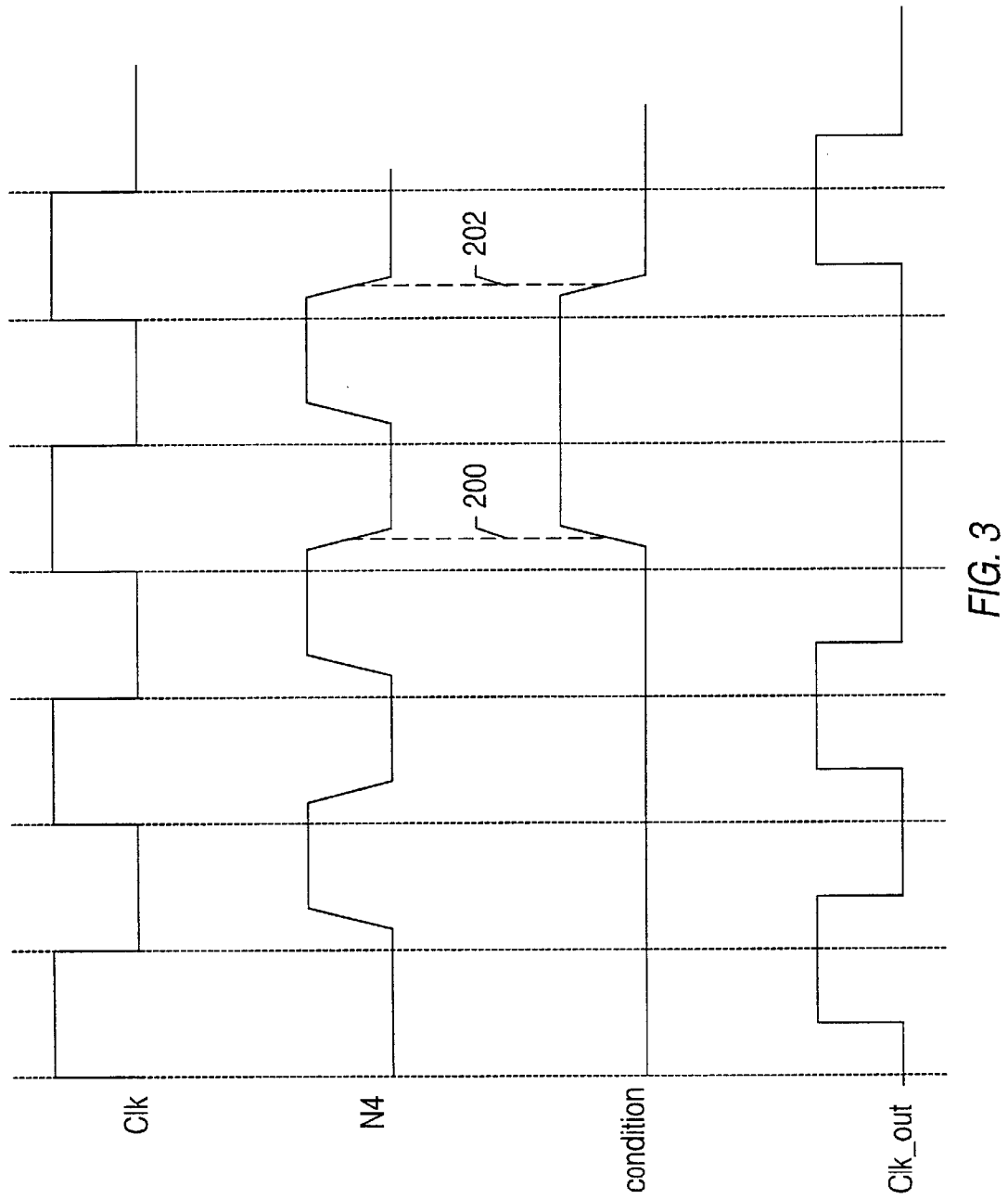
FIG. 3 is a timing diagram illustrating the operation of one embodiment of a clock buffer circuit.

Turning now to FIG. 3, a timing diagram illustrating the operation of one embodiment of clock buffer circuit 120 of FIG. 2 is shown. Timing diagrams may be different for other embodiments (e.g. embodiments wherein quadrature clock signals are used to double the rate of the output clock). Clock buffer circuit 120 may receive an input clock signal, Clk, and produce an output clock signal, Clk_out, when the condition signal is de-asserted. The signal on the node N4 is also shown in FIG. 3. When the condition signal becomes asserted, clock buffer circuit 120 may respond by inhibiting transitions of the output clock signal. Inhibiting the clock signal for this embodiment may result in clock buffer circuit 120 preventing a positive-going transition of the output clock signal with the first rising edge of the input clock signal following assertion of the condition signal. Specifically, the condition signal is shown asserting in FIG. 3 approximately coincident with the falling edge of the signal on the node N4 (reference numeral 200). After the condition signal is de-asserted, the transitions of the output clock signal may then resume with the next rising edge of the input clock signal. The condition signal is shown deasserting in FIG. 3 approximately coincident with the falling edge of the signal on the node N4 (reference numeral 202).

It is noted that the shift in time between the clock signal Clk and the clock signal Clk_out may not be to scale with respect to the period of the clock signals. The period of time for the transitions of the signal on node N4 and the condition signal may be somewhat expanded to illustrate relationships therebetween.

Figure 4:
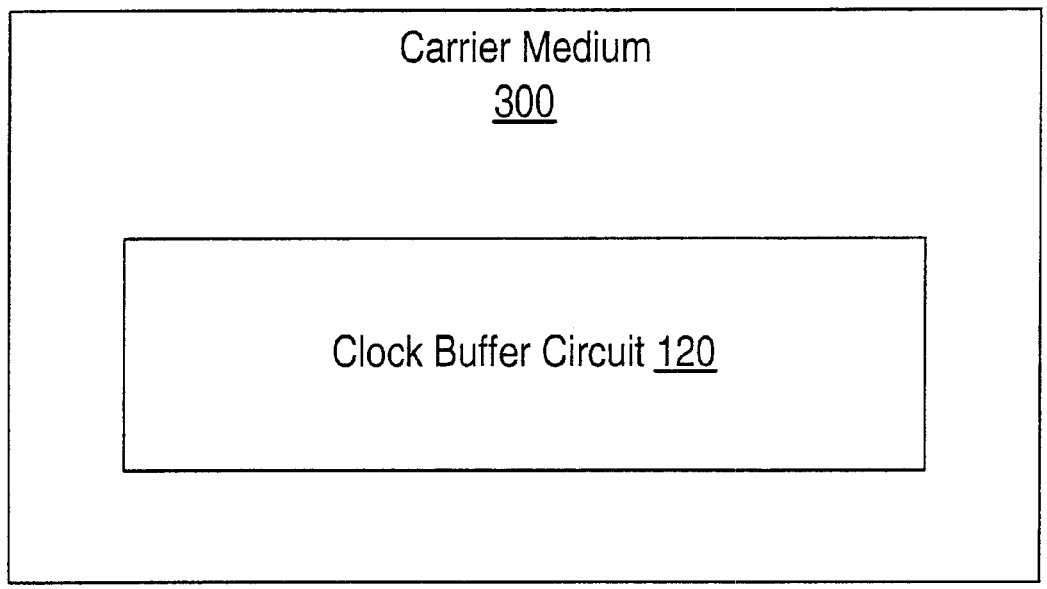
FIG. 4 is a block diagram of one embodiment of a carrier medium.

Turning next to FIG. 4, a block diagram of a carrier medium 300 including one or more data structures representative of the clock buffer circuit 120 is shown. Generally speaking, a carrier medium may include storage media such as magnetic or optical media, e.g., disk or CD-ROM, volatile or non-volatile memory media such as RAM (e.g. SDRAM, RDRAM, SRAM, etc.), ROM, etc., as well as transmission media or signals such as electrical, electromagnetic, or digital signals, conveyed via a communication medium such as a network and/or a wireless link.

Generally, the data structure(s) of the clock buffer circuit 120 carried on carrier medium 300 may be read by a program and used, directly or indirectly, to fabricate the hardware comprising the processor 10. For example, the data structures may include one or more behavioral-level descriptions or register-transfer level (RTL) descriptions of the hardware functionality in a high level design language (HDL) such as Verilog or VHDL. The description may be read by a synthesis tool which may synthesize the description to produce one or more netlists comprising a list of gates from a synthesis library. The netlist comprises a set of gates which also represent the functionality of the hardware comprising the clock buffer circuit 120. The netlist may then be placed and routed to produce a data set describing geometric shapes to be applied to masks. The masks may then be used in various semiconductor fabrication steps to produce a semiconductor circuit or circuits corresponding to the clock buffer circuit 120. Alternatively, the data structure(s) on carrier medium 300 may be the netlist(s) (with or without the synthesis library) or the data set(s), as desired.

While carrier medium 300 carries a representation of the clock buffer circuit 120, other embodiments may carry a representation of any portion of the clock buffer circuit 120 or circuitry including the clock buffer circuit, conditional logic and functional logic. Portions of the clock buffer circuit 120 may include any subset of the transistors shown in FIG. 4, etc.

It is noted that, while CMOS transistors have by used herein with a gate terminal which controls the electrical connection between source and drain terminals, other types of transistors may be used. Generally, a transistor may include at least three terminals, one of which is a control terminal for controlling the electrical connection between the other two terminals. For example, the gate terminal of a field effect transistor (such as a CMOS transistor) or the base terminal of a bi-polar junction transistor may be control terminals for those types of transistors.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A clock buffer circuit comprising:
   a precharge circuit coupled to a first node, wherein the precharge circuit is configured to precharge the first node responsive to a clock signal, and wherein the first node represents an output clock of the clock buffer circuit;
   a first transistor having a first terminal coupled to the first node, a second terminal, and a first control terminal; and
   a second transistor having a third terminal coupled to the first control terminal, a fourth terminal coupled to the second terminal, and a second control terminal coupled to receive a condition signal separate from the clock signal, wherein the second transistor, in response to an assertion of the condition signal, approximates a short circuit between the first control terminal and the second terminal.

2. The clock buffer circuit as recited in claim 1 further comprising a third transistor having a fifth terminal coupled to the second terminal, a sixth terminal coupled to a ground reference, and a third control terminal coupled to receive a clock signal, wherein the third transistor activates in response to a first phase of the clock signal.

3. The clock buffer circuit as recited in claim 2 wherein the precharge circuit is coupled to receive the clock signal, and wherein the precharge circuit is configured to precharge the first node in response to a second phase of the clock signal.

4. The clock buffer circuit as recited in claim 1 wherein the precharge circuit is further coupled to the first control terminal and is configured to precharge the first control terminal.

5. The clock buffer circuit as recited in claim 1 further comprising a third transistor having a fifth terminal coupled to a voltage reference, a sixth terminal coupled to the first control terminal, and a third control terminal coupled to the first node.

6. A carrier medium comprising one or more data structures representing:
   a precharge circuit coupled to a first node, wherein the precharge circuit is configured to precharge the first node responsive to a clock signal, and wherein the first node represents an output clock of a clock buffer circuit;

a first transistor having a first terminal coupled to the first node, a second terminal, and a first control terminal; and a second transistor having a third terminal coupled to the first control terminal, a fourth terminal coupled to the second terminal, and a second control terminal coupled to receive a condition signal separate from the clock signal, wherein the second transistor, in response to an assertion of the condition signal, approximates a short circuit between the first control terminal an the second terminal.

7. The carrier medium as recited in claim 6 wherein the one or more data structures further represent a third transistor having a fifth terminal coupled to the second terminal, a sixth terminal coupled to a ground reference, and a third control terminal coupled to receive a clock signal, wherein the third transistor activates in response to a first phase of the clock signal.

8. The carrier medium as recited in claim 7 wherein the precharge circuit is coupled to receive the clock signal, and wherein the precharge circuit is configured to precharge the first node in response to a second phase of the clock signal.

9. The carrier medium as recited in claim 6 wherein the precharge circuit is further coupled to the first control terminal and is configured to precharge the first control terminal.

10. The carrier medium as recited in claim 6 wherein the one or more data structures further represent a third transistor having a fifth terminal coupled to a voltage reference, a sixth terminal coupled to the first control terminal, and a third control terminal coupled to the first node.

11. A carrier medium comprising one or more data structures representing:

a precharge circuit configured to precharge a first node and a second node;

a first transistor having a first terminal coupled to the first node, a second terminal, and a first control terminal coupled to receive a condition signal;

a second transistor having a third terminal coupled to the second node, a fourth terminal coupled to the second terminal, and a second control terminal coupled to the first node; and a third transistor having a fifth terminal coupled to the second terminal and the fourth terminal, a sixth terminal, and a third control terminal coupled to receive a clock signal;

wherein the first transistor is activated responsive to the condition signal, and wherein the second transistor is prevented from discharging the second node responsive to the first transistor being activated, the second node representing an output clock signal from the clock buffer circuit.

12. The carrier medium as recited in claim 11, wherein the precharge circuit includes a fourth transistor and a fifth transistor coupled to the first node and the second node, respectively, and having control terminals coupled to receive the clock signal.

13. The carrier medium as recited in claim 12, wherein the sixth terminal of the third transistor is further coupled to a reference node, and the fourth transistor and the fifth transistor are each further coupled to a voltage node.

14. The carrier medium as recited in claim 11, wherein the one or more data structures further represent an output circuit coupled between the second node and a node on which the output clock signal is conveyed, wherein the output circuit includes an inverter and a sixth transistor, wherein the sixth transistor is coupled to the second node.

15. The carrier medium as recited in claim 11, wherein the one or more data structures further represent a seventh transistor, the seventh transistor coupled to the first node.

16. The carrier medium as recited in claim 11, wherein the one or more data structures further represent a condition input circuit, wherein the condition input circuit includes a first passgate.

17. The carrier medium as recited in claim 16, wherein the condition input circuit further comprises a second passgate, wherein the second passgate is configured to receive a feedback signal from the second node.

18. The carrier medium as recited in claim 17, wherein the condition input circuit is configured to drive the condition signal to the first transistor.

* * * * *